United States Patent
Lin et al.

(10) Patent No.: US 6,711,956 B2
(45) Date of Patent: Mar. 30, 2004

(54) METHOD AND APPARATUS FOR REGULATING EXHAUST PRESSURE IN EVACUATION SYSTEM OF SEMICONDUCTOR PROCESS CHAMBER

(75) Inventors: Yu-An Lin, Hsin-Chu (TW); Long-Wen Lin, Hsin-Chu (TW); Wen-Cheng Lai, Hsin-Chu (TW); Chang-Ping Lin, Hsing-Chu (TW)

(73) Assignee: Macronix International Co., Ltd., Hsin-chu (TW)

( * ) Notice: Subject to any disclaimer, the term of this patent is extended or adjusted under 35 U.S.C. 154(b) by 96 days.

(21) Appl. No.: 09/984,903

(22) Filed: Oct. 31, 2001

(65) Prior Publication Data

US 2003/0079550 A1 May 1, 2003

(51) Int. Cl.$^7$ .............................. G01L 7/00; F16K 31/12
(52) U.S. Cl. ........................................ 73/756; 137/487.5
(58) Field of Search ................................ 73/756, 866.5, 73/745, 744, 752, 746, 706, 715; 137/487.5

(56) References Cited

U.S. PATENT DOCUMENTS

| | | | | |
|---|---|---|---|---|
| 4,872,355 A | * | 10/1989 | Rohrberg et al. | 285/125.1 |
| 5,452,613 A | * | 9/1995 | Bills et al. | 73/706 |
| 5,791,369 A | * | 8/1998 | Nishino et al. | 137/269 |
| 5,816,285 A | * | 10/1998 | Ohmi et al. | 137/487.5 |
| 5,865,205 A | * | 2/1999 | Wilmer | 137/2 |
| 5,911,238 A | * | 6/1999 | Bump et al. | 137/487.5 |
| 6,119,710 A | * | 9/2000 | Brown | 137/14 |
| 6,450,200 B1 | * | 9/2002 | Ollivier | 137/624.12 |

* cited by examiner

Primary Examiner—Edward Lefkowitz
Assistant Examiner—C. Dickens

(57) ABSTRACT

In accordance with the present invention, an apparatus and a method for regulating exhaust pressure in an evacuation system of a semiconductor process chamber are provided. The method comprises steps of generating a first pressure in the semiconductor process chamber with the evacuation system, monitoring the first pressure to generate a first signal, determining a set point for the exhaust pressure responsive to the first signal, and regulating the exhaust pressure by a controller till reaching the set point. The key aspect of the present invention is to maintain the equilibrium of the chamber pressure and the exhaust pressure by implementing an exhaust controller to control the gas flow rate introduced into the evacuation system. In other words, when the chamber pressure is increased, the gas is introduced into the evacuation system at an increased flow rate. On the other hand, when the chamber pressure is decreased, the gas is introduced into the evacuation system at a decreased flow rate. The dynamic control over the gas introduced into the evacuation system advantageously increase the speed of response during the changes of chamber pressure, as well as active control of the chamber pressure in place of moving the throttle valve. Thus, by minimizing the movement of throttle valve, the chances of particulate contamination of the process are greatly reduced.

14 Claims, 2 Drawing Sheets

METHOD AND APPARATUS FOR REGULATING EXHAUST PRESSURE IN EVACUATION SYSTEM OF SEMICONDUCTOR PROCESS CHAMBER

BACKGROUND OF THE INVENTION

1. Field of the Invention

The present invention generally relates to a method and an apparatus for regulating exhaust pressure in an evacuation system of a semiconductor process chamber, and more particularly to a method and an apparatus for regulating exhaust pressure in an evacuation system of a semiconductor process chamber by use of an exhaust controller to control the gas flow rate introduced into the evacuation system.

2. Description of the Prior Art

Various semiconductor processes comprise treating wafers in a controlled evacuated environment, such as chemical vapor deposition process or plasma etching process. Such processes are generally carried out in a process chamber in which wafers are variously processed under a vacuum condition and an evacuation system connected to the process chamber. When the process starts, selected gases used for processing are mixed and introduced into the process chamber at rates according to the process recipe. Typically, during processing, pressures below one Torr need to be maintained in the process chamber. Therefore, the evacuation system continuously removes gases from the process chamber, and thereby maintains the desired pressure.

In general, a semiconductor evacuation system comprises lots of units such as pumps, scrubber, and valves. When independently implementing these units no surprising hardship exists if the application is satisfied with each requirement of the units, however, significant difficulties often arise from the application of integrating theses units. Thus, for an evacuation system, to achieve an optimum adjustment between these units is a way to improve the effectiveness of the evacuation system. The evacuation system typically comprises a turbo pump separated from the process chamber by a throttle valve. The throttle valve controlled by a pressure controller can be opened or closed to increase or decrease the vacuum supplied from the turbo pump to the process chamber for the purpose of maintaining the desired pressure in the process chamber. In this way, the pressure in the process chamber is controlled, but the pressure in the evacuation system (or pressure in the exhaust pipe) is not controlled likely leading to back diffusion, which may carry the particles back upstream to the process chamber contaminating the sidewall of the chamber or the wafer.

In the plasma etching process, for example, the reaction by-products such as particles and impurities are normally carried away (or exhausted) through the evacuation system to a scrubber for treatment before released to the atmosphere. However, some by-products are usually adhered to the inter-surface of the exhaust pipe or those of system units (such as pumps, and valves), once the equilibrium of the chamber pressure and the exhaust pressure is destroyed, a turbulent flow is likely occurred leading to the back diffusion of carrying particles back upstream to the process chamber causing product defects due to the contamination. Furthermore, the throttle valve is also a source of contamination for the chamber due to the accumulation of impurities and particles on its surface. During any pressure fluctuations in the chamber, a back-fill of contaminating particles from the throttle valve is prone to occur. Therefore, to ensure a constant and efficient exhaust is critical to processes involving a vacuum condition.

In view of the prior art described above, an apparatus and a method for securing a constant and efficient exhaust and reducing the activity frequency of throttle valve to improve the product reliability and promote the yield are highly desirable.

SUMMARY OF THE INVENTION

The present invention is directed toward a method and an apparatus for regulating exhaust pressure in an evacuation system of a semiconductor process chamber. The key aspect of the present invention is to maintain the equilibrium of the chamber pressure and the exhaust pressure by implementing an exhaust controller to control the gas flow rate introduced into the evacuation system. In other words, when the chamber pressure is increased, the extra gas is introduced into the evacuation system at an increased flow rate. On the other hand, when the chamber pressure is decreased, the extra gas is introduced into the evacuation system at a decreased flow rate. The dynamic control over the gas introduced into the evacuation system advantageously increases the speed of response during the changes of chamber pressure, as well as active control of the chamber pressure in place of moving the throttle valve. Thus, by minimizing the movement of throttle valve, the chances of particulate contamination of the process are greatly reduced.

It is another object of this invention that a method and an apparatus for reducing the activity frequency of the throttle valve are provided.

It is a further object of this invention that a method and an apparatus for optimizing the equilibrium of the chamber pressure and the exhaust pressure are provided.

It is another further object of this invention that a method and an apparatus for securing a constant and smooth exhaust that prevents the reflux of contaminants from inducing product defects are provided.

In accordance with the present invention, in one embodiment, an apparatus for regulating exhaust pressure in a semiconductor process chamber is provided. The apparatus comprises a vacuum pump, a first pressure sensor, a second pressure sensor, and a controller. The vacuum pump has an exhaust side and an intake side through a throttle valve coupled with the semiconductor process chamber for generating a first pressure in the process chamber and an exhaust pressure in-between the throttle valve and the intake side, wherein the first pressure is monitored by the first pressure sensor generating a first signal. The second pressure sensor is for monitoring the exhaust pressure in the intake side and the throttle valve to generate a second signal. The controller responsive to the first signal and the second signal regulates the exhaust pressure in the intake side, wherein the first pressure is higher than the exhaust pressure. The apparatus further comprises a gas port positioned upstream (or the intake side) of the vacuum pump. The controller regulates the exhaust pressure by controlling a gas flow rate introduced through the gas port. A method for regulating exhaust pressure in an evacuation system of a semiconductor process chamber is also provided. The method comprises steps of generating a first pressure in the semiconductor process chamber and an exhaust pressure in-between the process chamber and the evacuation system, monitoring the first pressure to generate a first signal, determining a set point for the exhaust pressure responsive to the first signal, and regulating the exhaust pressure by a controller till reaching the set point, wherein the first pressure is higher than the second pressure. The set point for the exhaust pressure can be pore-stored in the exhaust controller related to the chamber pressure. That is, every chamber pressure has a corresponding value for the exhaust pressure. The controller regulates the exhaust pressure by controlling a gas flow rate introduced through the gas port.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be noted that the present invention can be practiced in a wide range of other embodiments besides those explicitly described, and the scope of the present invention is expressly not limited except as specified in the accompanying claims.

Figure 1:
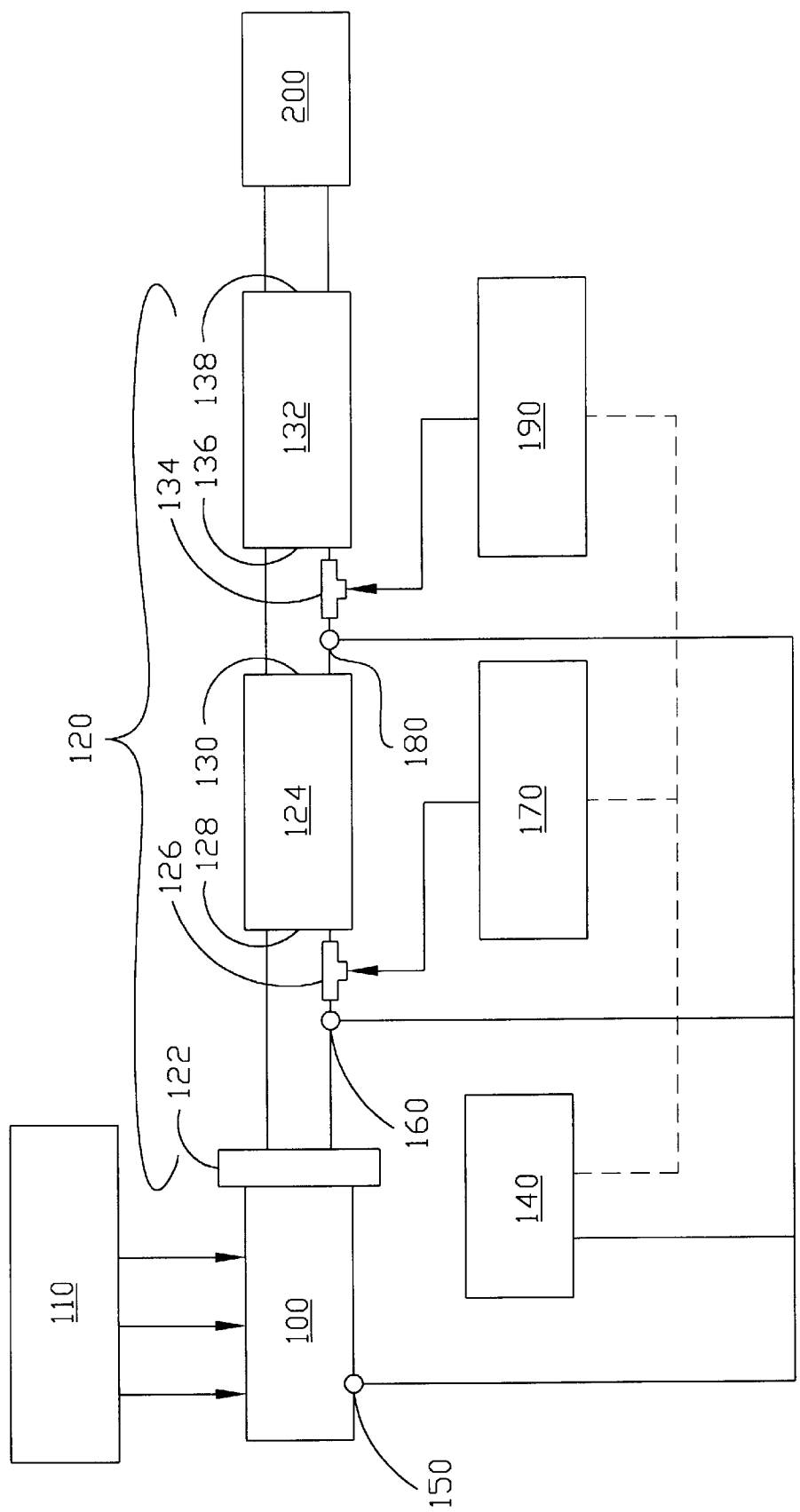
FIG. 1 is a schematic view of the apparatus regulating exhaust pressure in accordance with the present invention.

In accordance with the present invention, in one embodiment, an apparatus for regulating exhaust pressure in an evacuation system of a semiconductor process chamber is provided. Referring to FIG. 1, during a vacuum process, a wafer is arranged on a support assembly within the process chamber 100, which is kept under vacuum. Process gases are introduced into the process chamber 100 by a gas supply system 110. The gas supply system supplies process gases to the process chamber 100 at flow rates according to the requirements of a process recipe. The evacuation system 120 serves to create and maintain the vacuum in the process chamber 100 comprising a control valve 122, a first vacuum pump 124, and a first gas port 126. The intake side 128 of the first vacuum pump 124 is coupled to the process chamber 100 separated by the control valve 122. The control valve 122 can be any type of valves such as throttle valve, which has a throttling effect on the gas flow between the process chamber 100 and the evacuation system 120 for regulating the pressure in the process chamber 100. The first gas port 126 is positioned downstream from the control valve 122 or the intake side 128 of the first vacuum pump 124.

Additionally, the evacuation system 120 may further comprise more than one vacuum pump and gas port, such as a second vacuum pump 132 and a second gas port 134 shown in FIG. 1. The exhaust side 130 of the first vacuum pump 124 is coupled to the intake side 136 of the second vacuum pump 132. The first vacuum pump 124 can be a high vacuum pump such as turbo pump and the second pump 132 is usually a rotary pump. In general, the second vacuum pump 132 initially pumps down the process chamber 100 from atmospheric pressure to a rough vacuum pressure, and the first vacuum pump 124 continues to reduce pressure when the second pump 132 reaches its low pressure limit. The second gas port 134 is position downstream from the first vacuum pump 124 (the exhaust side 130 of the first vacuum pump 124) or the intake side 136 of the second vacuum pump 132.

One key aspect of the present invention is to maintain a smooth downstream exhaust in an evacuation system, that is, pressures at different exhaust stages in the evacuation system are preferred in a decreased order. Therefore, the by-products generated in the process can be easily exhausted from the process chamber through the evacuation system. In other words, the first exhaust pressure (P2) at the first exhaust stage of the first vacuum pump is lower than the pressure (P1) in the process chamber (or the chamber pressure), and the second exhaust pressure (P3) at the second exhaust stage of the second vacuum pump is lower than the first exhaust pressure (P2), that is pressures P1 is greater than P2, and P2 is greater than P3 (P1>P2>P3) to achieve the equilibrium of the chamber pressure and the exhaust pressure.

Some applications in the prior art, an extra gas preferable to be a neutral gas such as nitrogen (or ballast gas or purge gas) is introduced into the evacuation system through the gas ports of the evacuation system to increase the speed of response during pressure set point changes, as well as active control of the chamber pressure in place of moving the control valve. The extra gas introduction may control the chamber pressure, advantageously reducing the need for control valve position changes. However, the extra gas is usually introduced into the evacuation system at a fixed flow rate, which may results in contamination in the process chamber when the chamber pressure is beyond the control range at the fixed flow rate. As the process gases flowing into the process chamber are increased, that is the chamber pressure is increased, the fixed gas flow rate is significantly set too low to maintain a smooth exhaust. Thus, the agitated exhaust results in the peeling of impurities such as polymer coated on the sidewall of the process chamber, which induces product defects. The other hand, as the process gases flowing into the process chamber are decreased, that is the chamber pressure is decreased, the fixed gas flow rate is significantly too high, a turbulent flow likely occurred resulting in the reflux of contaminants from the evacuation system to the process chamber.

Therefore, in order to resolve the drawbacks of the prior art, the other key aspect of the present invention is to maintain the equilibrium of the chamber pressure and the exhaust pressure by implementing an exhaust controller 140 to control the gas flow rate introduced into the evacuation system 120. The implement of the exhaust controller 140 dynamically controlling the flow rate of gas introduced into the evacuation system 120 through the gas ports responsive to the chamber pressure and the exhaust pressure prevents the drawbacks of a fixed gas flow rate.

Referring to FIG. 1 again, a first pressure sensor 150 is for detecting the pressure (P1) in the process chamber 100 to generate a first signal. The exhaust controller 140 responsive to the first signal regulates the first exhaust pressure till the first exhaust pressure (P2) detected by a second pressure sensor 160 reaching a corresponding value, which is compatible with the aspect of smooth downstream exhaust (P1>P2). The corresponding value of the first exhaust pressure can be pore-stored in the exhaust controller 140 related to the chamber pressure. That is, every chamber pressure has a corresponding value for the first exhaust pressure. The step of regulating the first exhaust pressure is achieved by controlling the flow rate of gas 170 introduced into the evacuation system 120 through the first gas port 126. In other words, when the process gases flowing into the process chamber 100 are increased, the exhaust controller 140 responsive to the first signal dynamically increased the gas flow rates introduced into the evacuation system 120 to achieve the equilibrium of the chamber pressure and the exhaust pressure. The other hand, when the process gases flowing into the process chamber 100 are decreased, the exhaust controller 140 responsive to the first signal, dynamically decreased the gas flow rates introduced into the evacuation system 140 to achieve the equilibrium of the chamber pressure and the exhaust pressure.

Additionally, when more than one vacuum pump such as two are coupled in series in the evacuation system shown in FIG. 1. The second pressure sensor 160 also generates a second signal during the first exhaust pressure detection. The exhaust controller 140 responsive to the first signal and the second signal regulates the second exhaust pressures till the second exhaust pressure (P3) detected by a third pressure sensor 180 reaching a corresponding value, which is compatible with the aspect of smooth downstream exhaust (P1>P2>P3). The step of regulating the second exhaust pressure is achieved by controlling the flow rate of gas 190 introduced into the evacuation system 140 through the second gas port 134. The apparatus can further comprises a scrubber 200 for handling materials exhausted from the evacuation system 140.

Due to the dynamic control over the gas flow rates introduced into the evacuation system, the activity frequency of throttle valve (control valve) is reduced, thereby particles generated from the position changes of the throttle valve is diminished. It is noted that the extra gas can be introduced via the first gas port and the second gas port directly into or immediately upstream from the first vacuum pump and the second vacuum pump, respectively, thereby effectively regulating the exhaust pressures (P2, P3), thus minimizing the amount of movement of the control valve. Therefore, the amount of particulate matter introduced and the chances of particulate contamination of the process are greatly reduced.

Figure 2:
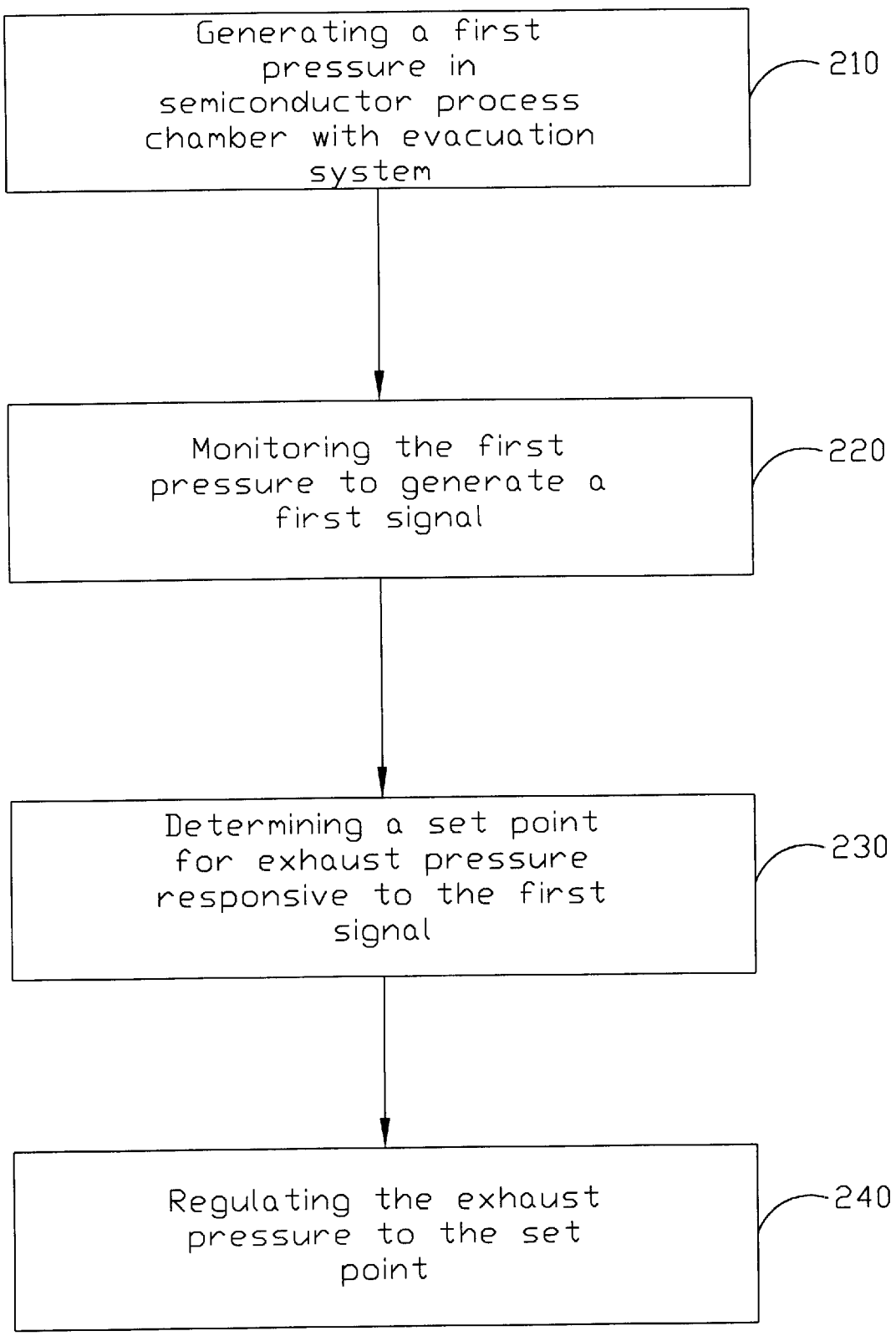
FIG. 2 is a flow diagram of regulating exhaust pressure in accordance with present invention.

In another embodiment, a method for regulating exhaust pressure in an evacuation system is also provided. Referring to FIG. 2, a flow diagram in accordance with the present invention to regulate the exhaust pressure is illustrated. The method comprises steps 210, 220, 230, and 240 as depicted in FIG. 2. As illustrated in step 210, by use of an evacuation system, a first pressure is generated in a semiconductor process chamber and an exhaust pressure in-between the semiconductor process chamber and the evacuation system. The first pressure or named chamber pressure in the semiconductor process chamber is detected to generate a first signal, as depicted in step 220. Responsive to the first signal, a second pressure is determined in step 230, wherein the first pressure is higher than the value of the second pressure. Then, in step 240, an exhaust controller regulates the exhaust pressure in the evacuation system till reaching the second pressure by controlling a ballast gas introduced into the exhaust system. The value of the second pressure can be pore-stored in the exhaust controller related to the chamber pressure. That is, every chamber pressure has a corresponding value for the second pressure. The exhaust controller regulates the exhaust pressure in the evacuation system by controlling the opening and closing of a controllable valve of a gas port, where the ballast gas is introduced into the evacuation system. Due to the dynamic control over the ballast gas, the exhaust pressure is effectively controlled responsive to the chamber pressure. Thus, the movement of the control valve is minimized, thereby the chances of particulate contamination of the process is greatly reduced.

Although specific embodiments have been illustrated and described, it will be obvious to those skilled in the art that various modifications may be made without departing from what is intended to be limited solely by the appended claims.

What is claimed is:

1. An apparatus for regulating exhaust pressure in a semiconductor process chamber, said apparatus comprising:
   a first vacuum pump having a first exhaust side and a first intake side through a throttle valve coupled with said semiconductor process chamber for generating a first pressure in said semiconductor process chamber and a first exhaust pressure in-between said throttle vale and said first intake side;
   a first pressure sensor for monitoring said first pressure to generate a first signal in said semiconductor process chamber;
   a second pressure sensor for monitoring said first exhaust pressure to generate a second signal;
   an extra gas source for introducing a gas through a first gas port located between said throttle valve and said first intake side; and
   a controller responsive to said first signal and said second signal to regulate a flow rate of said gas to secure and maintain said first pressure higher than said first exhaust pressure, so that a smooth downstream exhaust can be maintained and by-products generated can be exhausted from the semiconductor process chamber through the apparatus for regulating exhaust pressure.

2. The apparatus according to claim 1, further comprising a set point of said first exhaust pressure corresponding to said first pressure pre-stored in said controller, and said controller regulating said first exhaust pressure till said set point is reached.

3. The apparatus according to claim 1, further comprising a second vacuum pump having a second exhaust side, and a second intake side coupled to said first exhaust side of said first vacuum pump.

4. The apparatus according to claim 3, further comprising a third pressure sensor monitoring a second exhaust pressure in said second intake side to generate a third signal.

5. The apparatus according to claim 4, wherein said exhaust controller responsive to said second signal and said third signal to regulate said second exhaust pressure in said second intake side, and said first exhaust pressure is higher than said second exhaust pressure.

6. The apparatus according to claim 3, further comprising a second gas port positioned upstream of said second vacuum pump.

7. The apparatus according to claim 6, wherein said controller regulates said second exhaust pressure by controlling a second gas flow rate introduced through said second gas port.

8. An apparatus for regulating exhaust pressure in a semiconductor process chamber, said apparatus comprising:
   a vacuum pump having an exhaust side and an intake side coupled with said semiconductor process chamber for generating a first pressure in said semiconductor process chamber;
   a throttle valve positioned between said semiconductor process chamber and said vacuum pump to create an exhaust pressure in-between said semiconductor process chamber and said vacuum pump;
   a first pressure sensor for monitoring said first pressure to generate a first signal in said semiconductor process chamber;
   a second pressure sensor for monitoring said exhaust pressure in said intake side; and
   a controller responsive to said first signal to regulate said exhaust pressure in said intake side to a set point, wherein said first pressure is higher than said set point of said exhaust pressure, and a smooth downstream exhaust can be maintained and by-products generated can be exhausted from the semiconductor process chamber through the apparatus for regulating exhaust pressure.

9. The apparatus according to claim 8, further comprising a gas port positioned between said intake side of said vacuum pump and said throttle valve.

10. The apparatus according to claim 9, wherein said controller regulates said exhaust pressure to said set point by controlling a gas flow rate introduced through said gas port.

11. A method for regulating exhaust pressure in an evacuation system of a semiconductor process chamber, said method comprising:

generating a first pressure in said semiconductor process chamber and an exhaust pressure in-between said semiconductor process chamber and said evacuation system with said evacuation system;

monitoring said first pressure to generate a first signal;

determining a set point for said exhaust pressure responsive to said first signal; and regulating said exhaust pressure to said set point to secure and maintain said first pressure higher than said exhaust pressure, so that a smooth downstream exhaust can be maintained and by-products generated can be exhausted from the semiconductor process chamber through the evacuation system.

12. The method according to claim 11, wherein said set point for said exhaust pressure is lower than said first pressure.

13. The method according to claim 11, wherein said step of determining said set point for said exhaust pressure comprises selecting said set point for said exhaust pressure pre-stored in a controller corresponding to said first pressure.

14. The method according to claim 11, wherein said step of regulating said exhaust pressure comprises by use of a controller to regulate said exhaust pressure to said set point by controlling a gas flow rate introduced in-between said semiconductor process chamber and said evacuation system.

* * * * *